United States Patent
Karam et al.

Patent Number: 6,150,603
Date of Patent: Nov. 21, 2000

[54] BILAYER PASSIVATION STRUCTURE FOR PHOTOVOLTAIC CELLS

[75] Inventors: Nasser H. Karam, Northridge; James H. Ermer, Burbank; Richard R. King, Newbury Park; Moran Haddad, Winnetka; Bruce T. Cavicchi, North Hollywood, all of Calif.

[73] Assignee: Hughes Electronics Corporation, El Segundo, Calif.

[21] Appl. No.: 09/298,248

[22] Filed: Apr. 23, 1999

[51] Int. Cl.$^7$ .................................... H01L 31/0232
[52] U.S. Cl. ............................ 136/252; 136/256
[58] Field of Search .................. 136/249, 252, 136/262, 260, 265, 246, 256; 257/24, 279

[56] References Cited

U.S. PATENT DOCUMENTS

| | | |
|---|---|---|
| 4,017,332 | 4/1977 | James . |
| 4,255,211 | 3/1981 | Fraas . |
| 4,332,974 | 6/1982 | Fraas . |
| 5,100,478 | 3/1992 | Kawabata . |
| 5,322,573 | 6/1994 | Jain et al. . |
| 5,407,491 | 4/1995 | Freundlich et al. . |
| 5,800,630 | 9/1998 | Vilela et al. . |

Primary Examiner—Ellis Robinson
Assistant Examiner—Michael Miggins
Attorney, Agent, or Firm—V. D. Duraiswamy; M. W. Sales

[57] ABSTRACT

An improved photovoltaic cell, according to one embodiment, includes a base layer; a primary window layer having a first type of doping, with the primary window layer being disposed over the base layer; and a secondary window layer having the first type of doping, with the secondary window layer being disposed over the primary window layer. In another embodiment, the improved photovoltaic cell has a multilayer back-surface field structure; a base layer disposed over the back-surface field structure; and a primary window layer disposed over the base layer. In yet another embodiment, the photovoltaic cell includes a base layer; and a primary window layer disposed over the base layer, with the primary window layer having a thickness of at least about 1000 Angstroms.

5 Claims, 3 Drawing Sheets

BILAYER PASSIVATION STRUCTURE FOR PHOTOVOLTAIC CELLS

This invention was made with Government support under contract number F33615-95-C5561 awarded by the Government. The Government has certain rights in this invention.

BACKGROUND OF THE INVENTION

1. Field of the Invention

The present invention generally relates to photovoltaic cells and, more particularly, to an improved photovoltaic cell having a passivation structure that results in improved performance and efficiency.

2. Description of Related Art

The interest in photovoltaic (PV) cells continues as concerns over pollution and limited resources continue. The continued interest has been in both terrestrial and non-terrestrial applications. In the non-terrestrial environment of outer space, the concern over limited resources of any type is a major one. This is because the need to increase the amount of a resource increases the payload. And an increased payload can increase the cost of a launch more than linearly. But with the ready availability of solar energy in outer space for a spacecraft such as a satellite, the conversion of solar energy into electrical energy is an obvious alternative to increased payload. Irrespective of the application, and as with any energy generation system, efforts have been ongoing into increasing the output and/or efficiency of PV cells. In terms of output, multiple cells or layers having different energy bandgaps have been stacked so that each cell or layer can absorb a different part of the wide energy distribution in the sunlight. The stacked arrangement has been provided in a monolithic structure on a single substrate or on multiple substrates. Examples of multi-cell devices are shown in U.S. Pat. Nos. 5,800,630; 5,407,491; 5,100,478; 4,332,974; 4,255,211; and 4,017,332.

In the multiple cell device, semiconductor materials are typically lattice matched to form multiple p-n (or n-p) junctions. The p-n (or n-p) junctions can be of the homojunction or heterojunction type. When solar electromagnetic energy is received at a junction, excess charge carriers (i.e., electrons and holes) are generated in the conduction and valence bands in the semiconductor materials adjacent the junction. A voltage is thereby created across the junction and a current can be utilized therefrom. As the solar electromagnetic energy passes to the next junction which has been optimized to a lower energy range, additional solar energy but at this lower energy range can be converted into a useful current. With a greater number of junctions, there can be greater conversion efficiency and increased output voltage.

But for the multiple cell PV device, efficiency is limited by the requirement of low resistance interfaces between the individual cells to enable the generated current to flow from one cell to the next. Accordingly, in a monolithic structure, tunnel junctions and other conductive interfacing layers have been used to minimize the blockage of current flow. In a multiple wafer structure, metal grids or transparent conductive layers have been used for low resistance connectivity.

Another limitation to the multiple cell PV device is that current output at each junction must be the same for optimum efficiency in the series connection. Also, there is a practical limit on the number of junctions, since each successive junction incurs losses compared to a theoretical maximum.

The concern over efficiency in PV cells has created more interest in the use of germanium, gallium arsenide, indium phosphide, and gallium indium phosphide, which tend to be more efficient than their silicon predecessor. Indium phosphide, and phosphide semiconductors in general, have another advantage of being radiation resistant, which is of particular benefit in space applications.

Whether in the multiple junction or single junction PV device, a conventional characteristic of PV cells has been the use of a single window layer on an emitter layer disposed on a base/substrate, which is shown for example in U.S. Pat. No. 5,322,573. Alternatively, the single window layer is directly disposed on the base/substrate. In either instance, the single window layer serves as a passivation layer whereby minority carrier recombination is sought to be reduced at the front surface of the emitter layer (or base where there is no emitter layer). The reduction in surface recombination tends to increase cell efficiency.

Additionally, since the single window layer needs to be light transmissive, the single window layer has typically been relatively thin, i.e., less than about 100 nm thick and, for example, in the range of about 10 to 100 nm thick, as shown in U.S. Pat. No. 5,322,573. In fact, the past art has taught that the window layer should be as thin as possible, such as in U.S. Pat. No. 5,322,573. However, some of the disadvantages of the single window layer used in the past include the fact that minority carrier surface recombination can still occur to an extent that negatively impacts performance. Further, a relatively thin window layer may not present a satisfactory barrier to unwanted diffusion of impurities, which can produce shunts or crystalline defects. A thin window also provides less mechanical strength, smaller sheet conductivity to supplement the emitter in reducing lateral conductivity losses, and may not allow sufficient freedom to minimize reflectance losses.

Similar to the conventional use of single layer window has been the use of a single layer back-surface field structure below the base/substrate, as shown in U.S. Pat. No. 5,800,630. The typical purpose of the back-surface field structure has been to serve as a passivation layer like the single window layer described above. However, the disadvantages of the single layer back-surface field structure include those mentioned above with respect to a single window layer.

As can be seen, there is a need for an improved photovolaic cell, including one that can be incorporated into a multi-junction or single junction device. Also needed is an improved photovoltaic cell that is of a heterojunction type and can include either a p-n or n-p junction. Another need is for a photovoltaic cell that has increased efficiency and greater output voltage. A further need is for an improved passivation structure that can be used on a photovoltaic cell and, more generally, on a minority-carrier semiconductor device. Also needed is an improved passivation structure that can be used on a photovoltaic device that either contains or does not contain an emitter layer and/or back-surface field structure. A photovoltaic cell with a base made from Ge, GaAs, or GaInP is also needed with better efficiency.

SUMMARY OF THE INVENTION

The present invention is directed to an improved photovolatic cell that can improve efficiency in a multi-junction or single junction device. The improved photovoltaic cell is of a homojunction or a heterojunction type and can include either a p-n junction or n-p junction. The passivation structure of the present invention can not only be used on a photovoltaic cell, but on minority-carrier semiconductor devices in general. Further, the passivation structure of the present invention can be used on a photovoltaic device that either contains or does not contain an emitter layer and/or back-surface field structure. Among others, the base of the photovoltaic cell in the present invention can be made of Ge, GaAs, or GaInP.

Specifically, the improved photovoltaic cell includes a base layer of a first type of doping; a primary window layer having a second type of doping, with the primary window layer being disposed over the base layer; and a secondary window layer having the second type of doping, with the secondary window layer being disposed over the primary window layer.

In another embodiment of present invention, the improved photovoltaic cell includes a base layer of a first type of doping; an emitter layer of a second type of doping, with the emitter layer being disposed over the base layer; a primary window layer having a second type of doping, with the primary window layer being disposed over the emitter layer; and a secondary window layer having the second type of doping, with the secondary window layer being disposed over the primary window layer.

In yet another embodiment of present invention, the improved photovoltaic cell has a multilayer back-surface field structure; a base layer disposed over the back-surface field structure; and a primary window layer disposed over the base layer.

In a further embodiment, the photovoltaic cell of the present invention includes a base layer; and a primary window layer disposed over the base layer, with the primary window layer having a thickness of at least about 1000 Angstroms.

These and other features, aspects and advantages of the present invention will become better understood with reference to the following drawings, description, and claims.

DESCRIPTION OF THE PREFERRED EMBODIMENTS

Figure 1A:
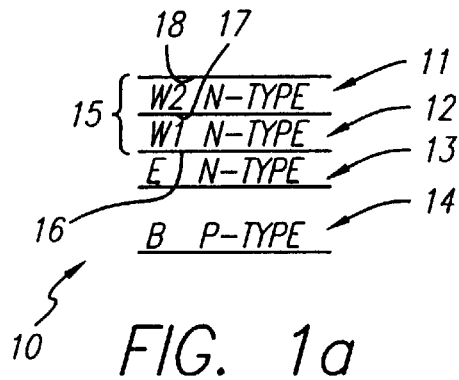
FIG. 1a is a diagram of an n-p type photovoltaic cell having an emitter according to the present invention.

The improved photovoltaic cell of the present invention is described below in various embodiments. In general, however, the photovoltaic cell of the present invention includes a window structure that acts as a passivation structure. More specifically, and according to one embodiment of the present invention, the window or passivation structure is made of two layers. In another embodiment (not shown in the drawings), the window or passivation structure is made of a single layer. The window structure receives solar energy and transmits it to an emitter layer and then to the base layer. Alternatively, the solar energy is transmitted from the window structure directly to a base layer such that the window structure also acts as an emitter layer. Optionally, the photovoltaic cell of the present invention can include a multilayer back-surface field structure that acts as a passivation structure.

Figure 6:
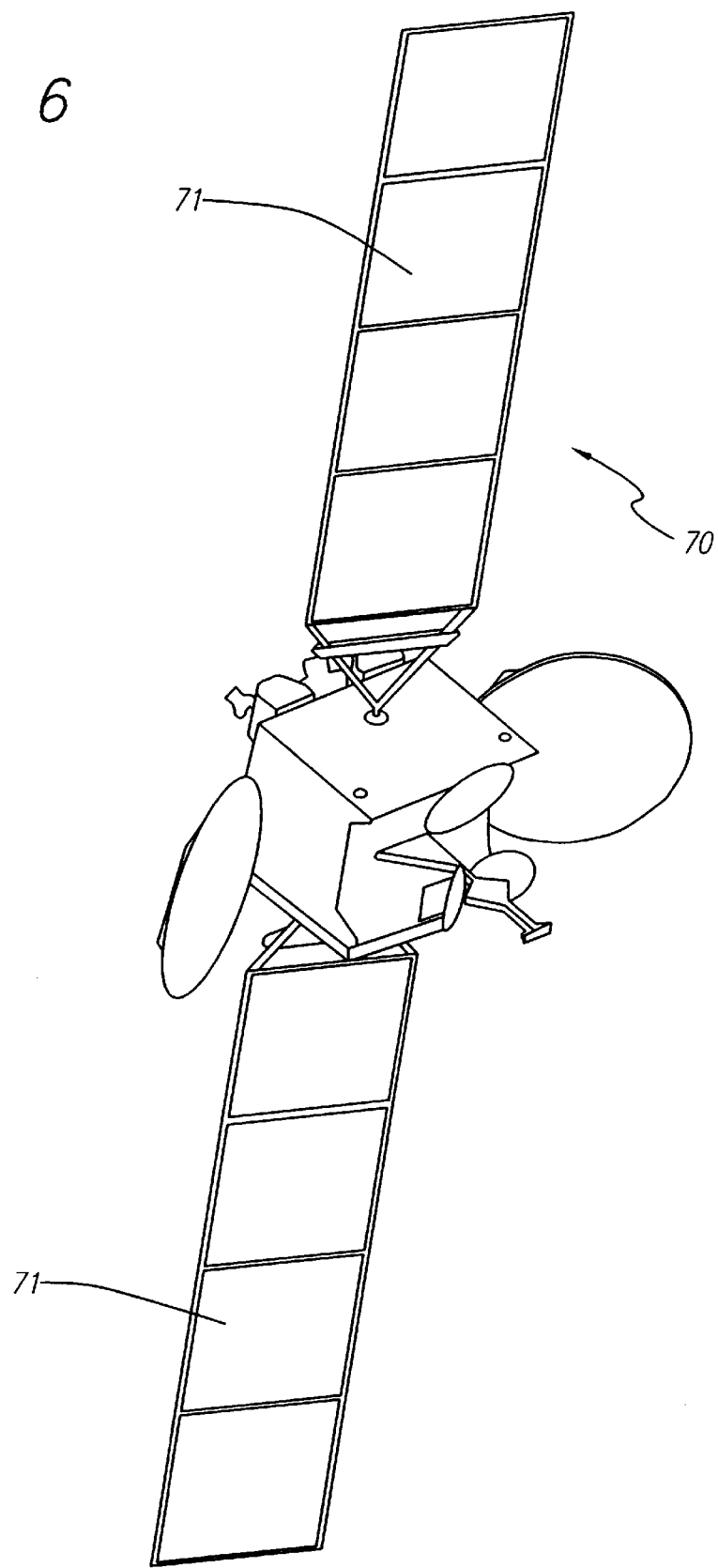
FIG. 6 depicts a satellite on which the photovoltaic cell of the present invention is utilized as part of a solar panel.

Furthermore, while the present invention may be particularly useful in the context of spacecraft, such as in a solar panel 71 of a satellite 70 (FIG. 6), other applications—both terrestrial and non-terrestrial—are contemplated. Still further, even though the present invention is described in the context of a photovoltaic cell, the invention is not so limited. Other contexts, such as heterojunction bipolar transistors, photodetectors, laser diodes, light emitting diodes, and minority-carrier semiconductor devices in general, are contemplated to be within the scope of the present invention.

Given the breadth of contexts of the present invention, it can be appreciated by those skilled in the art that the different semiconductor layers that comprise the minority-carrier semiconductor device of the present invention can be made by many well known processes in the art, such as molecular beam epitaxy (MBE), liquid phase epitaxy (LPE) and metal-organic chemical vapor deposition (MOCVD). In accordance with such known methods, the specific materials comprising the semiconductor layers may be altered and optimized to meet the requirements of the particular context.

FIG. 1a depicts a photovoltaic cell 10 according to one embodiment of present invention. In this embodiment, the cell 10 includes a window or passivation structure 15 that can receive solar energy preferably after the energy has first passed through an antireflection layer or coating (not shown)—or another component cell in a multifunction solar cell (also not shown)—that is disposed on top of the window structure 15, as viewed from FIG. 1a. The antireflection layer is intended to minimize surface reflections between the air and semiconductor layers of the cell 10, thereby enabling more photons to enter the cell 10. The antireflection layer can be made from well known materials in the art, such as $Al_2O_3$, $TiO_2$, $SiO_2$ or $Ta_2O_5$. The thickness of the antireflective coating can vary, but is typically between 30 nm to 150 nm.

In FIG. 1a, the window structure 15 is of a multilayer type. More specifically, in this particular embodiment, the window structure 15 is a bilayer type and, therefore, includes two layers. However, the present invention contemplates that the window structure 15 can include more than 2 layers. Nevertheless, for this embodiment, a secondary window layer 11 is disposed directly below the antireflective coating (not shown) and a primary window layer 12 is disposed directly below the secondary window layer 11 and above an emitter layer 13 described hereinafter. The secondary window layer 11 and primary window layer 12 are made of semiconductor materials having a first type doping, which is further described below. Although not necessary, the windows 11,12 are preferably lattice matched to one another.

The function of the window or passivation structure 15 is, in part, to passivate the emitter layer 13 which is made of a semiconductor material having the first type of doping and disposed directly under the window structure 15. In other words, as photogeneration occurs in the emitter layer 13, minority-carrier recombination (i.e., recombination of electrons and holes) tends to occur at a front surface (or interface) 16 of the emitter layer 13 where the solar energy enters such layer 13. But the provision of the primary window layer 12 serves to minimize the surface (or interface) recombination.

The ability of the primary window layer 12 to minimize surface (or interface) recombination is due to it having a wider energy bandgap in comparison to the emitter layer 13. Still, since photogeneration can occur in the primary window layer 12, minority-carrier recombination can also occur at a front surface 17 of the primary window layer 12 that interfaces with the secondary window layer 11. Therefore, the secondary window layer 11 is provided to minimize the surface (or interface) recombination at the surface (or interface) 17 of minority carriers in the primary window layer 12. This minimization is provided by the secondary window 11 by having a wider energy bandgap than the primary window 12. With reduced minority-carrier recombination at the front surface 17 of the primary window 12, a greater amount of current density can be collected from the total current density that is photogenerated in the primary window 12. Additionally, that same reduction minimizes the loss of minority-carriers that can be injected from the emitter layer 13 and into the primary window 12, thereby resulting in a higher voltage from the cell 10.

As can therefore be appreciated, additional window layers can be provided over the two window layers 11,12 to additionally minimize surface recombination that may occur at a front surface 18 of the secondary window 11. Yet, there is a practical limitation to the total number of windows since the added minimization does not increase linearly.

Irrespective of the number of window layers, and for the purpose of minimizing surface recombination, the difference in bandgap widths between adjacent windows in the progression of window layers moving upwards towards the antireflection layer need only be appreciable enough for the minority carriers to "see" wider and wider bandgaps. Nevertheless, the greater the difference in bandgaps of adjacent windows, the greater minimization of surface recombination, although the increased minimization will not be linear. On the other hand, as the difference in bandgap widths increase, then disadvantages can occur, such as difficulty in doping wide-bandgap materials. Accordingly, the difference in bandgap widths between the secondary and primary windows 11,12 should preferably range from about 30 meV to 1000 meV. Below about 30 meV, then surface recombination is not significantly suppressed; while above about 1000 meV, the above disadvantages tend to result.

Another function of the secondary window layer 11 can be to block unwanted diffusion of impurities such as dopants, or of point defects, into or out of the primary window layer 12. This is accomplished by virtue of greater physical distance (thickness) and improved control of stress (e.g., through the use of differing composition, doping, and thermal expansion coefficients in the layers) at primary and secondary window interfaces 17,18. In a contrary fashion, if such diffusion is desired, the secondary window layer 11 may be used to enhance the diffusion by varying the parameters of the layer such as the ones described above. The secondary window layer 11 may also serve as a better template, in comparison to the primary window layer 12, for growing subsequent high quality crystalline layers.

Given the above operating parameters of the secondary window layer 11, it can be seen that the window layers 11,12 can be made of a wide range of materials. As examples, the secondary window layer 11 can be made of GaInP, AlInP, AlGaInP, AlGaAs, GaInAsP or AlAs. With such materials for the secondary window layer 11, the primary window layer 12 may be respectively made, for example, of GaAs, GaInP (or GaAs), GaInP (or GaAs), GaInP (or GaAs), AlGaInP (or GaInP and GaAs), GaInAsP, AlInAsP, AlGaAsP or AlGaAs (or AlGaInP, GaInP and GaAs).

For the n-p type device shown in FIG. 1a, the first type of doping in both window layers 11,12 is n-type doping. The particular dopant used can vary according to well known methods in the art. For example, if the secondary window layer 11 is made of AlInP and the primary window layer 12 is made of GaInP, then the dopant in the secondary window 11 can be silicon and the dopant in the primary window 12 can be tellurium. Consequently, the dopant concentration in the primary and secondary windows 11,12 can be about 1 E17 to 1 E19 to (and preferably about 5 E17 to 5 E18).

Just as the types of materials can vary for the window layers 11,12, their thicknesses can also vary. Typically, however, the secondary window 11, in this embodiment, may range from about 100 Angstroms to 2000 Angstroms, although preferably about 250 Angstroms to 500 Angstroms. With such a thickness range for the secondary window 11, the primary window 12 may have a thickness that ranges from about 250 Angstroms to 5000 Angstroms, and preferably about 1000 Angstroms to 3000 Angstroms.

As shown in FIG. 1a, the emitter layer 13 is where some photogeneration and current generation occur in the cell 10, with most occurring in the base layer. The material comprising the emitter layer 13 is dependent upon the materials used for the window layers 11,12, as well as the base layer 14 described below. With the above examples for the window layers 11, 12, the emitter 13 can be made, for example, of InGaAsN, GaInAs, AlGaAs, GaInAsP, AlGaInP, and preferably GaAs or GaInP. The optimal thickness of the emitter layer 13 will also vary with the thickness of the window layers 11,12. Using the above thickness ranges for the window layers 11,12, the emitter layer 13 thickness can range from about 1000 Angstroms to 3000 Angstroms, and preferably from about 1500 Angstroms to 2500 Angstroms. As indicated in FIG. 1a, the emitter layer 13 contains the first type doping. Some examples of useful dopants in the emitter 13 include silicon, selenium, tellurium, tin (n-type dopants), although preferably tellurium. The dopant concentration in the emitter 13 can typically vary between about 0.9E18 to 5E18, and preferably between about 1E18 to 3E18.

Directly below the emitter layer 13 for the embodiment shown in FIG. 1a is a base or substrate layer 14 that provides structural integrity to the cell 10. Because this embodiment is an n-p type device, the base 14 and the substrate are made of materials having a second type doping—namely, p-type doping. Useful dopants include carbon, zinc, magnesium (p-type), even though zinc is preferred. Thereby, an n-p junction is formed at the junction (either homojunction or heterojunction) of the emitter layer 13 and the base layer 14. Across such junction, a voltage difference at the junction can be created due to the excess charge carriers photogenerated by the solar energy impingement. From the voltage difference, an output current is created that is carried out of the cell 10 via the base layer 14 and to an external termination (not shown).

To achieve its functions, the base layer 14 preferably has a bandgap width substantially the same as the emitter layer 13. With the need for equivalent bandgap widths, various materials can be used for the base 14, such as GaAs, GaInP, InGaAsN, AlGaAs, AlGaInP, GaInAs and GaInAs. The thickness of the base layer 14 can vary. But with the above thickness ranges for the emitter layer 13 and window structure 15, the base layer 14 thickness can typically range from about 0.25 to 5 micrometers, and preferably from about 0.3 to 4 micrometers.

Figure 1B:
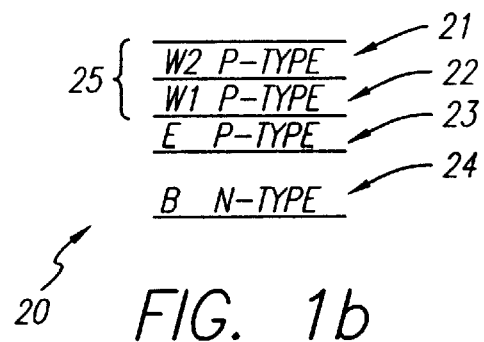
FIG. 1b is a diagram of a p-n type photovoltaic cell having an emitter according to the present invention.

FIG. 1b depicts another embodiment of the present invention. The embodiment is identical to that shown in FIG. 1a, except that the photovoltaic cell 20 is of a p-n type. Thus, the cell 20 includes a bilayer window or passivation structure 25 having a secondary window layer 21 and a primary window layer 22, both of which are made of a p-type doped material. An emitter layer 23 is disposed below the passivation structure 25 and made of a p-type doped material. The p-n junction is formed by having the base 24 made of an n-type doped material.

Figure 2A:
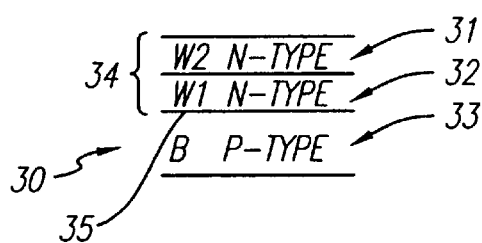
FIG. 2a is a diagram of an n-p type photovoltaic cell without an emitter according to the present invention.

FIG. 2a depicts yet another embodiment of an n-p type device according to the present invention. Therein, a photovoltaic cell 30 has the same construction of the cell 10 shown in FIG. 1a, except that no emitter layer is provided. As shown in FIG. 2a, the photovoltaic cell 30 includes a multilayer window or passivation structure 34 having a secondary window layer 31 and a primary layer window layer 32. With the omission of an emitter layer, the primary window layer acts 32 as both an emitter and a window. Both windows 31,32 are made of materials that have the same doping type—namely, n-type doping. Directly below the passivation structure 34, as viewed from FIG. 2a, is a base layer or substrate 33. Most of the photogeneration occurs in the base layer 33, as opposed to a separate emitter layer of the same bandgap. Consequently, a front surface 35 of the base 33 can be where minority-carrier recombination occurs, but which is minimized by the window structure 34.

For the embodiment shown in FIG. 2a, the secondary window layer 31 and primary window layer 32 can be made of the same materials and dopants as the windows 11,12 for the embodiment in FIG. 1a. Similarly, the thicknesses of the windows 31,32 may be of the same thicknesses for the windows 11,12. The thickness, materials, dopants and dopant concentrations of the base 33 are similar to the embodiment shown in FIG. 1a.

Figure 2B:
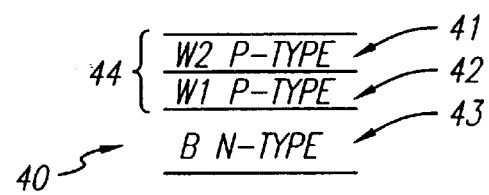
FIG. 2b is a diagram of a p-n type photovoltaic cell without an emitter according to the present invention.

FIG. 2b shows the same embodiment of the invention shown in FIG. 2a, except the former is for a p-n type device. As such, a photovoltaic cell 40 has a window or passivation structure 44 made of p-type doped materials in a secondary window layer 41 and primary window layer 42. With the passivation structure 44 being p-type, a base 43 is n-type.

Figure 3A:
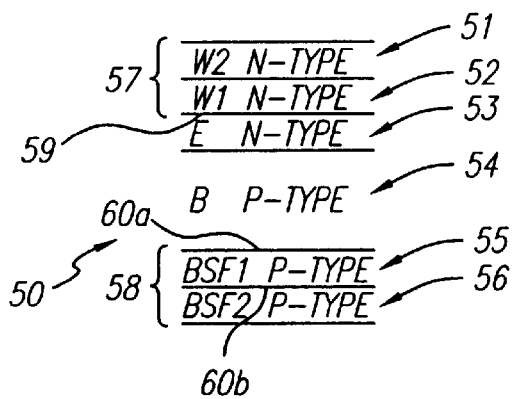
FIG. 3a is a diagram of an n-p type photovoltaic cell having an emitter and multilayer back-surface field structure according to the present invention.

FIG. 3a shows another embodiment of the present invention which is identical to that shown in FIG. 1a, except with the addition of a multilayer back-surface field (BSF) structure 58. With a photovoltaic cell 50 being of an n-p type, a window or passivation structure 57 includes n-doped material for both a secondary window layer 51 and a primary window layer 52. The difference in bandgap widths is similar to that of the passivation structure 15 of the FIG. 1a so that minority-carrier recombination at a front surface 59 of an emitter layer 53 can be reduced. The semiconductor materials, dopants, concentrations, and the thicknesses of the layers 51,52 can be similar to the layers 11,12 shown in FIG. 1a. In FIG. 3a, the emitter layer 53 is made of an n-type material and of a thickness similar to the emitter layer 13 shown in FIG. 1a. Likewise, a base layer 54 in FIG. 3a is made of a p-type material and of a thickness similar to the base layer 14 shown in FIG. 1a.

The BSF structure 58, as shown in FIG. 3a, is a bilayer type and includes a primary back-surface field layer 55 and secondary back-surface field layer 56. The BSF structure 58 provides a passivation function similar to the window structure 57, except that the BSF structure 58 minimizes minority-carrier surface recombination at a back surface 60a of the base 54, as well as a back surface 60b of the secondary BSF layer 56. Accordingly, the bandgap for the secondary BSF layer 56 is greater than that of the primary BSF layer 55. The BSF structure 58 can have more than two layers, as can the window structure 57. The BSF layers 55,56 are made of p-type doped materials. As examples, the primary BSF layer 55 can be made of GaAs, GaInP (or GaAs), GaInP (or GaAs), GaInP (or GaAs), AlGaInP (or GaInP and GaAs), GaInAsP, AlInAsP, AlGaAsP or AlGaAs (or AlGaInP, GaInP and GaAs) while the secondary BSF layer 56 can be made of of GaInP, AlInP, AlGaInP, AlGaAs, GaInAsP or AlAs. The dopants for the BSF layers 55,56 can include carbon, magnesium and zinc, although zinc is preferred. The dopant concentrations for both layers 55,56 can range from about 1E18 to 1E20 and preferably about 5 E18 to 2 E19. The thicknesses of the BSF layers 55,56 can vary. However, with the above thicknesses for the other layers in the cell 50, the BSF layer 55 can range from about 100 Angstroms to 4000 Angstroms, and the BSF layer 56 can also range from about 100 Angstroms to 4000 Angstroms. Preferably, the thicknesses range from about 500 Angstroms to 2000 Angstroms, and 200 Angstroms to 500 Angstroms, respectively.

Figure 3B:
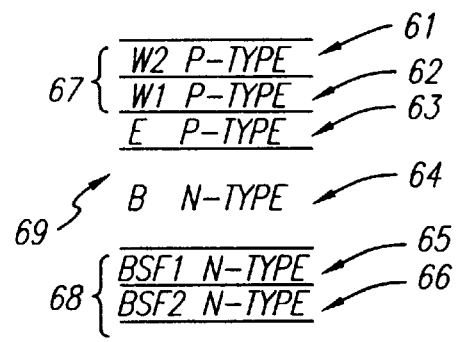
FIG. 3b is a diagram of a p-n type photovoltaic cell having an emitter and multilayer back-surface field structure according to the present invention.

FIG. 3b shows the same embodiment of the invention shown in FIG. 3a, except the former is for a p-n type device. As such, a photovoltaic cell 69 has a window or passivation structure 67 made of p-type doped materials in a secondary window layer 61 and primary window layer 62. An emitter layer 63 is also p-type doped. With the passivation structure 67 being p-type, a base 64 is n-type. A multilayer back-surface field (BSF) structure 68 includes a primary back-surface layer 65 and a secondary back-surface layer 66, both of which are n-type doped.

In yet another embodiment of the present invention, the photovoltaic cells depicted in FIGS. 1a through 3b can be constructed with a passivation structure having only a single "thick" window layer. The reference to "thick" is intended to distinguish the so-called "thin" single window layers used in the past. In particular, the "thick" single window layer of the present invention is characterized by a thickness of about 1000 Angstroms and greater. Preferably, the thickness ranges from about 1500 Angstroms to 3000 Angstroms. Below a thickness of about 1000 Angstroms, the beneficial effects of the window layer are diminished. Above a thickness of about 4000 Angstroms, light absorption in the window becomes excessive, and more time and materials than necessary are used in MOVPE growth.

As with the mutilayer window structure of the present invention, the single "thick" window layer can serve to block unwanted diffusion of impurities and/or point defects. It can also be used to enhance such diffusion. Accordingly, the single "thick" window of the present invention can be made from materials such as GaInP, AlInP,AlGaAs, AlInAsN and all previously mentioned primary and secondary window layer materials. The single window can include dopants such as silicon, selenium, tellurium and tin, but preferably silicon or tellurium. The dopant concentrations typically range from about 1E17 to 1E19, while 5 E17 to 5 E18 is preferred.

As can be appreciated by those skilled in the art, the photovoltaic cell of the present invention is not limited to use as a single junction cell. It can be incorporated into a multijunction photovoltaic cell. Further, the window or passivation structure of the present invention can be used in heterojunction semiconductor devices in general.

EXAMPLES

Figure 4:
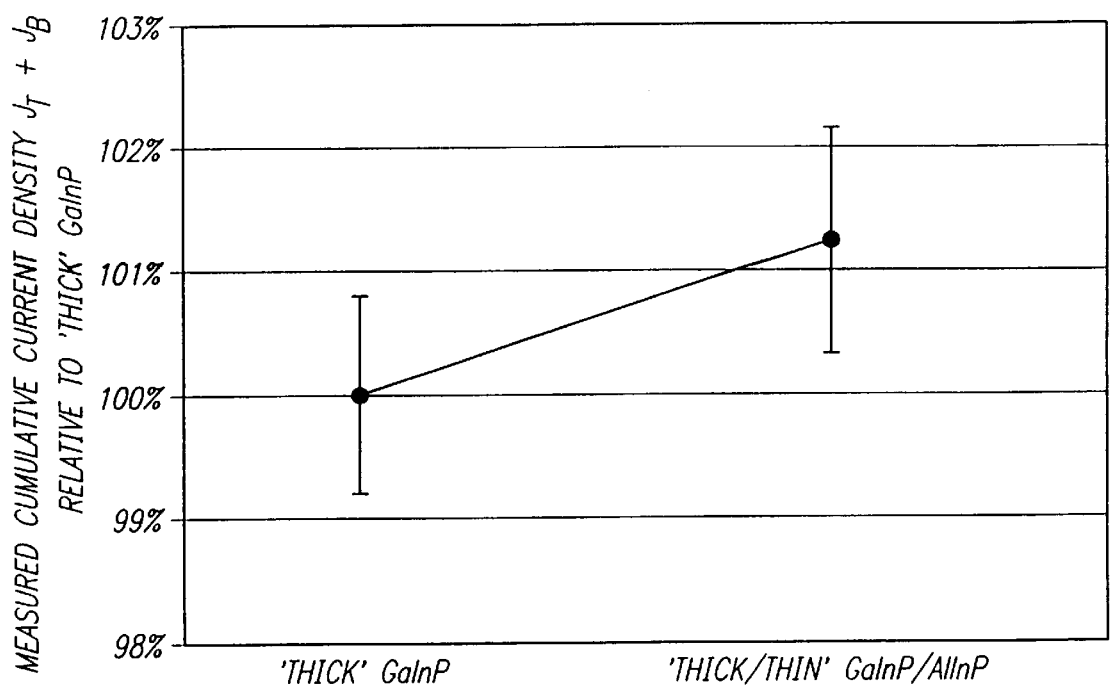
FIG. 4 is a graph depicting the sum of the measured current density obtained from measured external quantum efficiency for GaInP and GaAs component photovoltaic cells with a bilayer window on the Ga-As base cell as shown in FIG. 1, relative to that obtained for GaInP and GaAs component cells with a single layer window on the GaAs base cell.
Figure 5:
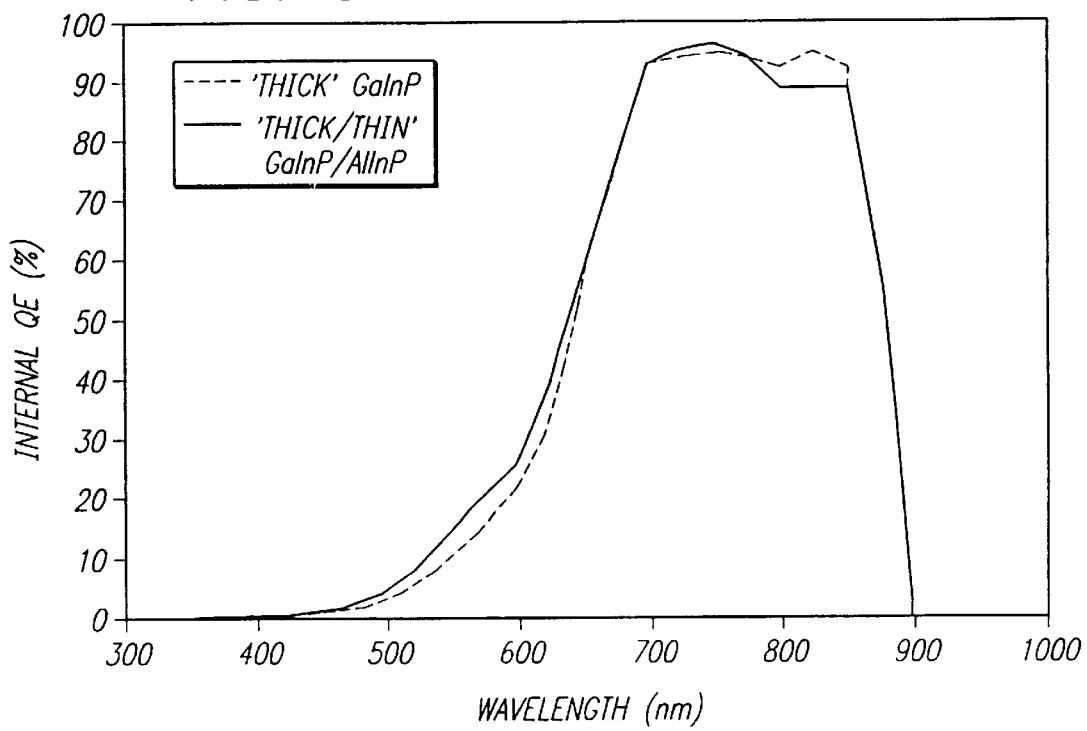
FIG. 5 is a graph depicting internal quantum efficiency vs. wavelength for a photovoltaic cell having a bilayer window on a GaAs base component cell, in accordance with FIG. 1, as well as a photovoltaic cell having a single window layer.

In FIG. 4, the data were measured on cells from several experiments to test the advantages of the bilayer window according to the present invention. The 'thick' GaInP middle-cell window (MCW) is a single-layer window of GaInP with a thickness of about 1500 to 3000 Angstroms. The 'thick/thin' GaInP/AlInP MCW is a bilayer window with a primary window layer of GaInP with a 1500 to 2500 Angstrom thickness, and a secondary window layer of AlInP with a 250 to 500 Angstrom thickness. In FIG. 5, the data was obtained using standard solar cell testing methods on cells from the above experiments.

As can be appreciated by those skilled in the art, the present invention provides improved efficiency in a multi-junction or single junction device. The improved photovoltaic cell is of a homojunction or a heterojunction type and can include either a p-n junction or n-p junction. Further, the passivation structure of the present invention can be used on a photovoltaic device that either contains or does not contain an emitter layer and/or back-surface field structure.

It should be understood, of course, that the foregoing relates to preferred embodiments of the invention and that modifications may be made without departing from the spirit and scope of the invention as set forth in the following claims.

What is claimed is:

1. A photovoltaic cell, comprising:
   a multilayer back-surface field structure in which one layer of said structure passivates another layer of said structure;
   a base layer disposed over said back-surface field structure;
   a primary window layer disposed over said base layer and characterized by a primary energy bandgap; and
   a secondary window layer disposed over said primary window layer, said secondary window layer being characterized by a secondary energy bandgap that is greater than said primary energy bandgap in order to passivate said primary window layer and thereby increase collection of photogenerated current from said primary window layer.

2. The photovoltaic cell of claim 1, further comprising an emitter layer disposed intermediate said base layer and primary window layer.

3. The photovoltaic cell of claim 2, further comprising one of a p-n junction and an n-p junction located at a heterojunction formed between said base layer and emitter layer.

4. The photovoltaic cell of claim 1, further comprising one of a p-n junction and an n-p junction located at a heterojunction formed between said base layer and said primary window layer.

5. The photovoltaic cell of claim 1, wherein said multilayer back-field passivation structure comprises a primary BSF layer and a secondary BSF layer, said secondary BSF layer being characterized by a secondary bandgap greater than a primary bandgap associated with said primary BSF layer so that the secondary BSF layer passivates the primary BSF layer.

* * * * *